(12) United States Patent
Campbell

(10) Patent No.: US 9,209,507 B1
(45) Date of Patent: Dec. 8, 2015

(54) MONOLITHIC WIDEBAND HIGH POWER TERMINATION ELEMENT

(71) Applicant: TriQuint Semiconductor, Inc., Hillsboro, OR (US)

(72) Inventor: Charles F. Campbell, McKinney, TX (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 167 days.

(21) Appl. No.: 13/929,429

(22) Filed: Jun. 27, 2013

Related U.S. Application Data

(60) Provisional application No. 61/835,444, filed on Jun. 14, 2013.

(51) Int. Cl.
| | | |
|---|---|---|
| *H01C 1/148* | (2006.01) | |
| *H01C 1/012* | (2006.01) | |
| *H01P 1/24* | (2006.01) | |
| *H01P 11/00* | (2006.01) | |
| *H03F 3/193* | (2006.01) | |

(52) U.S. Cl.
CPC .............. *H01P 1/24* (2013.01); *H01P 11/00* (2013.01); *H03F 3/193* (2013.01)

(58) Field of Classification Search
USPC ........ 257/724, 730, 736, 536, 537; 333/22 R, 333/216, 172, 18, 183–185; 330/124 R, 330/207 P, 295; 338/307, 309, 195
See application file for complete search history.

(56) References Cited

U.S. PATENT DOCUMENTS

| | | | | |
|---|---|---|---|---|
| 4,870,225 | A * | 9/1989 | Anao et al. ................... | 174/261 |
| 7,019,396 | B2 * | 3/2006 | Sawada et al. ............... | 257/724 |
| 7,795,966 | B2 * | 9/2010 | Wyse ........................ | 330/124 R |
| 8,102,641 | B2 * | 1/2012 | Koga ......................... | 361/306.3 |
| 8,164,178 | B2 * | 4/2012 | Katsuki et al. ............... | 257/703 |

* cited by examiner

*Primary Examiner* — Dinh Le
(74) *Attorney, Agent, or Firm* — Withrow & Terranova, P.L.L.C.

(57) ABSTRACT

Various embodiments may provide a termination element for a radio frequency (RF) power amplifier module. The termination element may include a resistive body having a first end, a second end, and first and second edges running from the first end to the second end opposite one another. The termination element may further include a first ground contact coupling the first end of the resistive body to a ground potential, and a second ground contact coupling the second end of the resistive body to the ground potential. The termination element may further include a conductive contact extending into the resistive body through the first edge, wherein an end of the conductive contact that is closest to the second edge is remotely disposed from the second edge by a gap.

19 Claims, 4 Drawing Sheets

MONOLITHIC WIDEBAND HIGH POWER TERMINATION ELEMENT

CROSS REFERENCE TO RELATED APPLICATIONS

The present application claims priority to U.S. Provisional Patent Application No. 61/835,444, filed on Jun. 14, 2013, and titled "MONOLITHIC WIDEBAND HIGH POWER TERMINATION ELEMENT," the entire disclosure of which is hereby incorporated by reference.

FIELD

Embodiments of the present disclosure relate generally to the field of circuits, and more particularly to a monolithic wideband high power termination element.

BACKGROUND

Some radio frequency (RF) power amplifiers include a balanced amplifier, in which a pair of amplifiers are coupled between a pair of quadrature couplers. An input quadrature coupler receives an input RF signal and splits it into two signals that are fed to respective inputs of the amplifiers. An output quadrature coupler combines the amplified signals produced by the amplifiers to produce an output RF signal that is fed into a load. Termination elements are connected to isolation ports of the quadrature couplers. The termination element of the output quadrature coupler must be able to handle the power reflected by the load under worst-case loading conditions.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "NB" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1A:
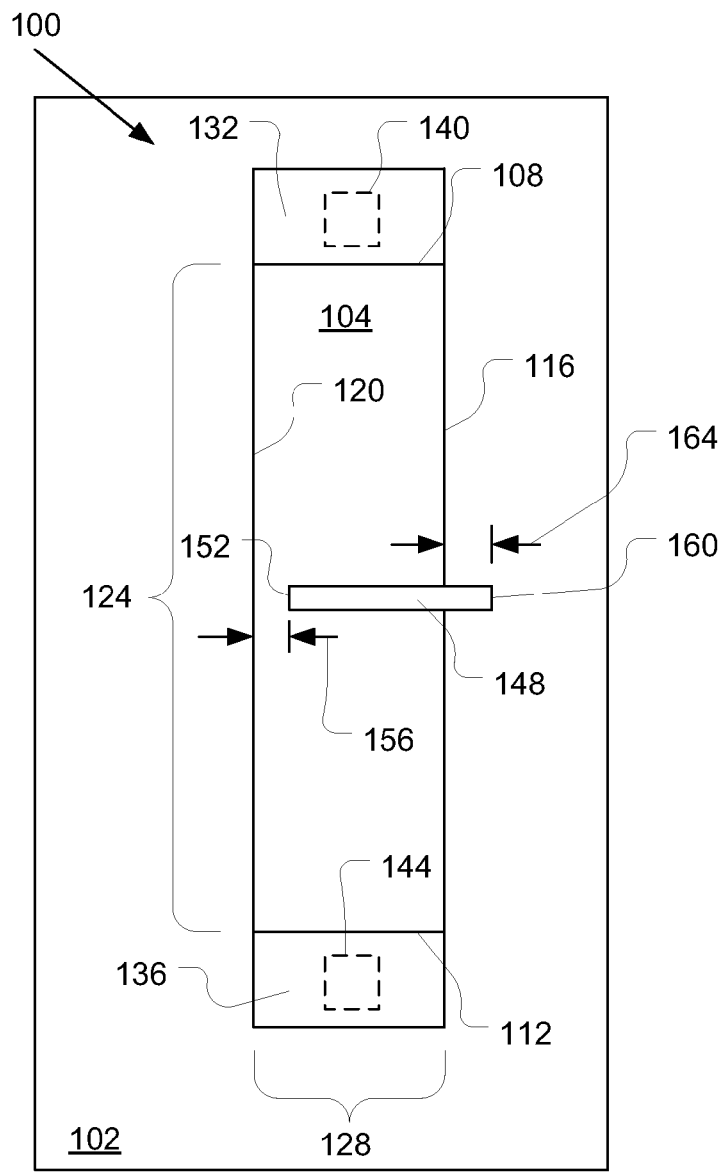
FIG. 1A schematically illustrates a termination element in accordance with various embodiments.
Figure 2:
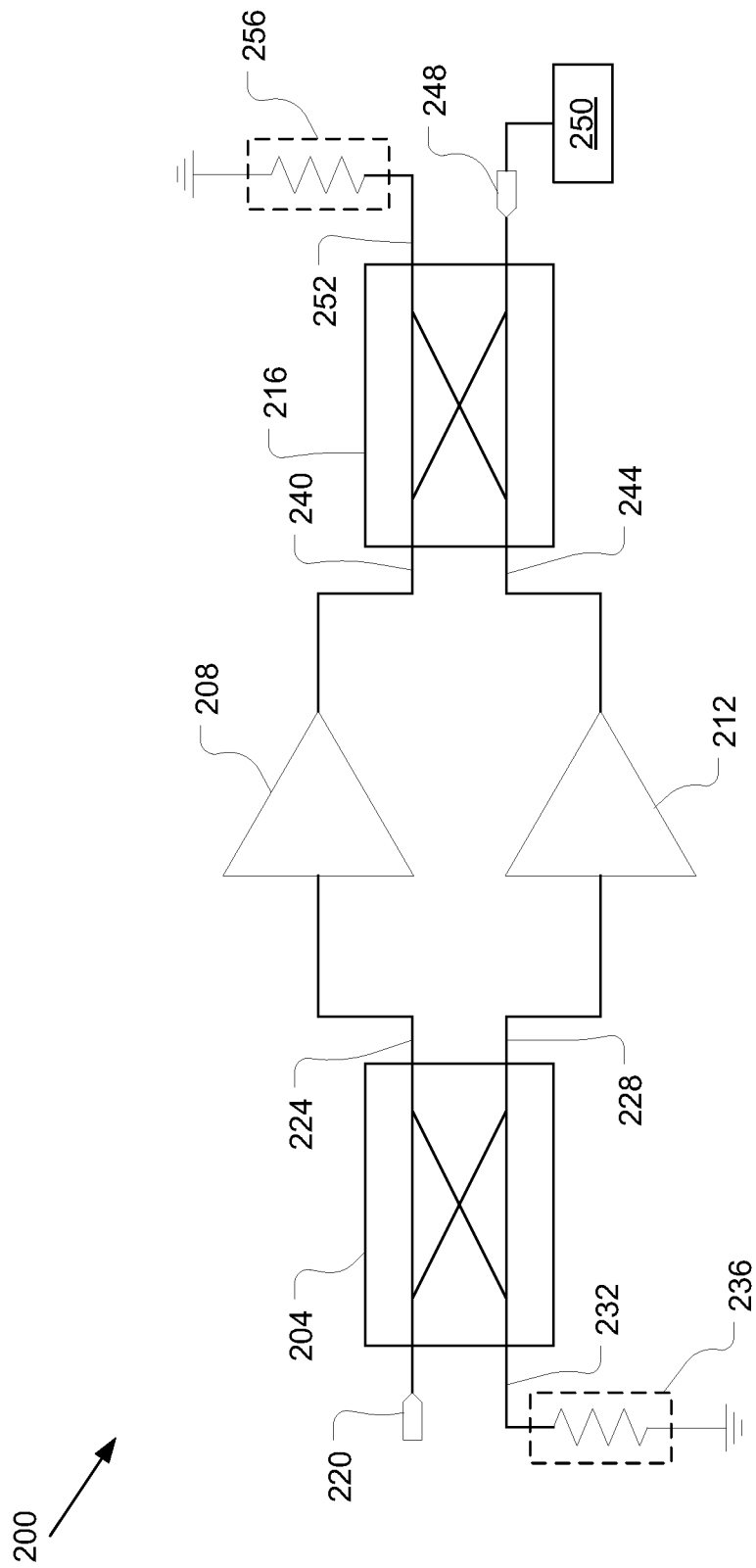
FIG. 2 schematically illustrates a power amplifier module including a pair of radio frequency power amplifiers coupled between a pair of quadrature couplers, and termination elements coupled with respective isolation ports of the quadrature couplers, in accordance with various embodiments.

FIG. 1A illustrates a termination element 100 in accordance with various embodiments. In various embodiments, termination element 100 may be a monolithic termination element disposed on a substrate 102 (e.g., a printed circuit board (PCB)). The termination element 100 may be coupled with an isolation port of a quadrature coupler, for example a quadrature coupler of an amplifier module 200 as shown in FIG. 2 and further discussed below. The termination element 100 may terminate the power reflected by a load connected to the quadrature coupler to provide a low return loss for the amplifier module at a frequency of the communication signals processed by the amplifier module. In other embodiments, the termination element 100 may be used in any other suitable circuit.

In some embodiments, the termination element 100 may be included in an amplifier module that operates at a radio frequency (RF). For example, in some embodiments, the termination element 100 may be included in a monolithic microwave integrated circuit (MMIC) that operates at a microwave frequency (e.g., a frequency of 300 MegaHertz (MHz) to 300 GigaHertz (GHz)). In various embodiments, the termination element 100 may provide a lower return loss at microwave frequencies than prior designs.

Termination element 100 may include a resistive body 104 having a first end 108 and a second end 112. The resistive body 104 may further include a first edge 116 and a second edge 120 running from the first end 108 to the second end 112 opposite one another. In some embodiments, as shown in FIG. 1A, the resistive body 104 may have a substantially rectangular shape, and the first end 108, second end 112, first edge 116, and second edge 120 may form respective sides of the rectangular shape. In some embodiments, a length 124 of the resistive body 104 between the first end 108 and second end 112 may be longer than a width 128 of the resistive body between the first edge 116 and the second edge 120. It will be apparent that other shapes and/or configurations of the resistive body 104 may be used in other embodiments.

In various embodiments, the termination element 100 may further include a first ground contact 132 and a second ground contact 136. The first ground contact 132 may be disposed adjacent the first end 108 of the resistive body 104 to connect the first end 108 to a ground potential. The second ground contact 136 may be coupled with the second end 112 of the resistive body 104 to connect the second end 112 to the ground potential. In some embodiments, the first ground contact 132 and second ground contact 136 may be coupled with the ground potential by one or more vias 140 and 144, respectively, disposed in the substrate 102.

In various embodiments, the termination element 100 may further include a conductive contact 148 coupled with the resistive body 104. The conductive contact 148 may extend into the resistive body 104 through the first edge 116. A first end 152 of the conductive contact 148 that is closest to the second edge 120 of the resistive body 104 may be remotely disposed from the second edge 120 by a first gap 156. In some embodiments, a second end 160 of the conductive contact 148, opposite the first end 152, may be remotely disposed from the second edge 116 (e.g., in a direction away from the resistive body 104) by a second gap 164.

Figure 1B:
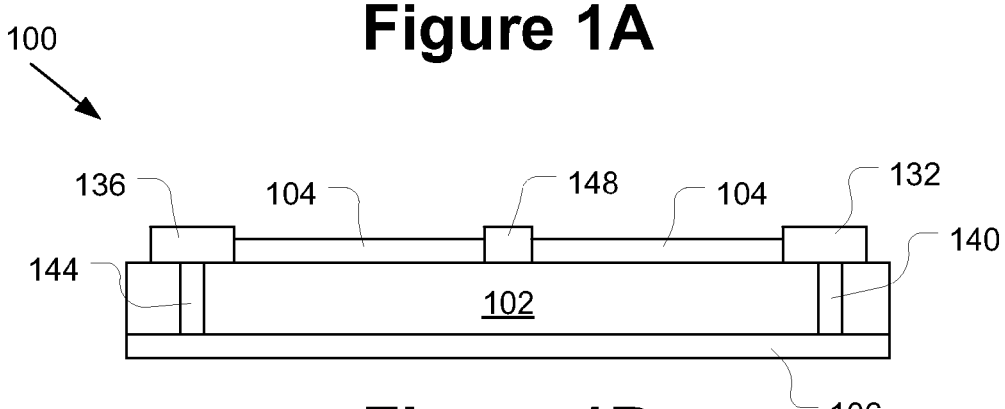
FIG. 1B schematically illustrates a cross-sectional view of the termination element of FIG. 1A, in accordance with various embodiments.

FIG. 1B illustrates a cross-sectional view of the termination element 100, showing the conductive contact 148 disposed between two portions of the resistive body 104 on die 102. Ground contacts 132 and 136 are disposed on opposing ends of the termination element 100. Ground contact 132 may be coupled with a backside metallization layer 106 of the die 102 via one or more vias 140, while ground contact 136 may be coupled with the backside metallization layer 106 via one or more vias 144.

In various embodiments, the termination element 100 may be modeled as two resistors coupled in series between the first ground contact 132 and the second ground contact 136 (e.g., one resistor between the first ground contact 132 and the common conductive contact 148, and the other resistor between the second ground contact 136 and the common conductive contact 148). In various embodiments, the first gap 156 may provide series inductance for the termination element 100. Additionally, the second gap 164 may provide another source of series inductance for the termination element 100. The series inductance provided by the first gap 156 and/or second gap 164 may provide a tunable return loss that is based on the frequency of the signals handled by the termination element 100. Accordingly, the values of the first gap 156 and second gap 164 may be adjusted to provide a low return loss at a frequency of the signals handled by the termination element 100.

For example, as discussed above, the termination element 100 may be included in an amplifier module. The values of the first gap 156 and second gap 164 may be determined based on a frequency of a communication signal processed by the amplifier module to provide a low return loss at the frequency of the communication signal. The frequency response of the return loss provided by the termination element 100 may allow relatively wideband operation of the termination element 100. For example, the termination element 100 may be used in circuits that operate at microwave frequencies, such as MMICs.

FIG. 2 illustrates an amplifier module 200 in accordance with various embodiments. The amplifier module 200 may include an input coupler 204 (also referred to as a power dividing coupler), a first RF amplifier 208, a second RF amplifier 212, and an output coupler 216 (also referred to as a power combining coupler). In some embodiments, the input coupler 204 and output coupler 216 may be quadrature couplers. In some embodiments, the amplifier module 200 may be an MMIC that amplifies microwave frequency signals.

The input coupler 204 may include an input port 220 that receives an input signal (e.g., an RF input signal, such as a microwave frequency input signal). The input coupler 204 may further include a first output port 224, a second output port 228, and an isolation port 232. The first output port 224 may be coupled with an input of the first RF amplifier 208, and the second output port 228 may be coupled with an input of the second RF amplifier 212. The first output port 224 and second output port 228 may pass power-divided versions of the input signal to the inputs of the first RF amplifier 208 and second RF amplifier 212. A termination element 236 may be coupled with the isolation port 232 to absorb power reflected from the inputs of the first amplifier 208 and/or second amplifier 212.

The output coupler 216 may include a first input port 240 coupled with an output terminal of the first RF amplifier 208, and a second input port 244 coupled with an output terminal of the second RF amplifier 212. The first RF amplifier 208 and second RF amplifier 212 may amplify signals received at their input terminals, and pass the amplified signals to their respective output terminals. The output coupler 216 may further include an output port 248 that passes an output signal based on the signals received at the first input port 240 and second input port 244. For example, the output signal at the output port 248 may be a power-combined version of the signals received at the first input port 240 and second input port 244. The output port 248 may be coupled with a load 250 to pass the output signal to the load 250.

The output coupler 216 may further include an isolation port 252. A termination element 256 may be coupled with the isolation port 252. The termination element 256 may terminate signal power reflected from the load 250 to prevent return loss in the amplifier module 200. In some embodiments, the termination element 236 and/or 256 may have a nominal impedance of about 50 Ohms, although other impedance values may also be used.

In various embodiments, the termination element 256 may embody the termination element 100 discussed herein. Additionally, or alternatively, the termination element 236 may embody the termination element 100 discussed herein. The first gap 156 and second gap 164 of the termination element 100 may be determined to provide a series inductance for the transistor element 100 that provides a low return loss for amplifier module 200 at a frequency of the input signal received at input port 220.

In prior termination elements, the return loss provided by the termination element increased with frequency (e.g., due to the parasitic shunt capacitance provided by the physical dimensions of the termination element), and at microwave frequencies, the return loss provided by prior termination elements is significant enough to negatively impact the performance of the associated circuit. This problem is exacerbated for amplifier modules having higher power amplifiers (e.g., 5 Watts or more).

In contrast, the termination element 100 may provide a tunable frequency response for the return loss provided by the termination element 100 (e.g., based on the values of the first gap 156 and/or second gap 164). Thus, the values of the first gap 156 and/or second gap 164 may be chosen to provide a low frequency response at a frequency of the input signal to be processed by the amplifier module 200. The termination element 100 may be capable of handling high power (e.g., an incident RF power of 2.5 Watts or more), and may therefore be suitable for amplifier modules having high power amplifiers. For example, in some embodiments, the first RF amplifier 208 and second RF amplifier 212 may have a power rating of 5 Watts or more.

Referring again to FIG. 1A, the conductive contact 148 may be any suitable shape and have any suitable orientation with respect to the resistive body 104. For example, in some embodiments, the conductive contact 148 may be rectangular, as shown in FIG. 1A. In other embodiments, the conductive contact 148 may have a non-rectangular shape, which may provide a different frequency response for the termination element 100 than a rectangular shape. Additionally, or alternatively, in some embodiments, the conductive contact 148 may be oriented orthogonally to the first edge 116 of the resistive body 104 (e.g., with a long axis of the conductive contact 148 oriented orthogonally to the first edge 116).

In various embodiments, the resistive body 104 may be formed of any suitable material. For example, the resistive body 104 may be formed of Tantalum Nitride (TaN) in some embodiments.

As discussed above, the termination element 100 may be a monolithic termination element. For example, the termination element 100 may be formed in one or more layers on the substrate 102.

Figure 3:
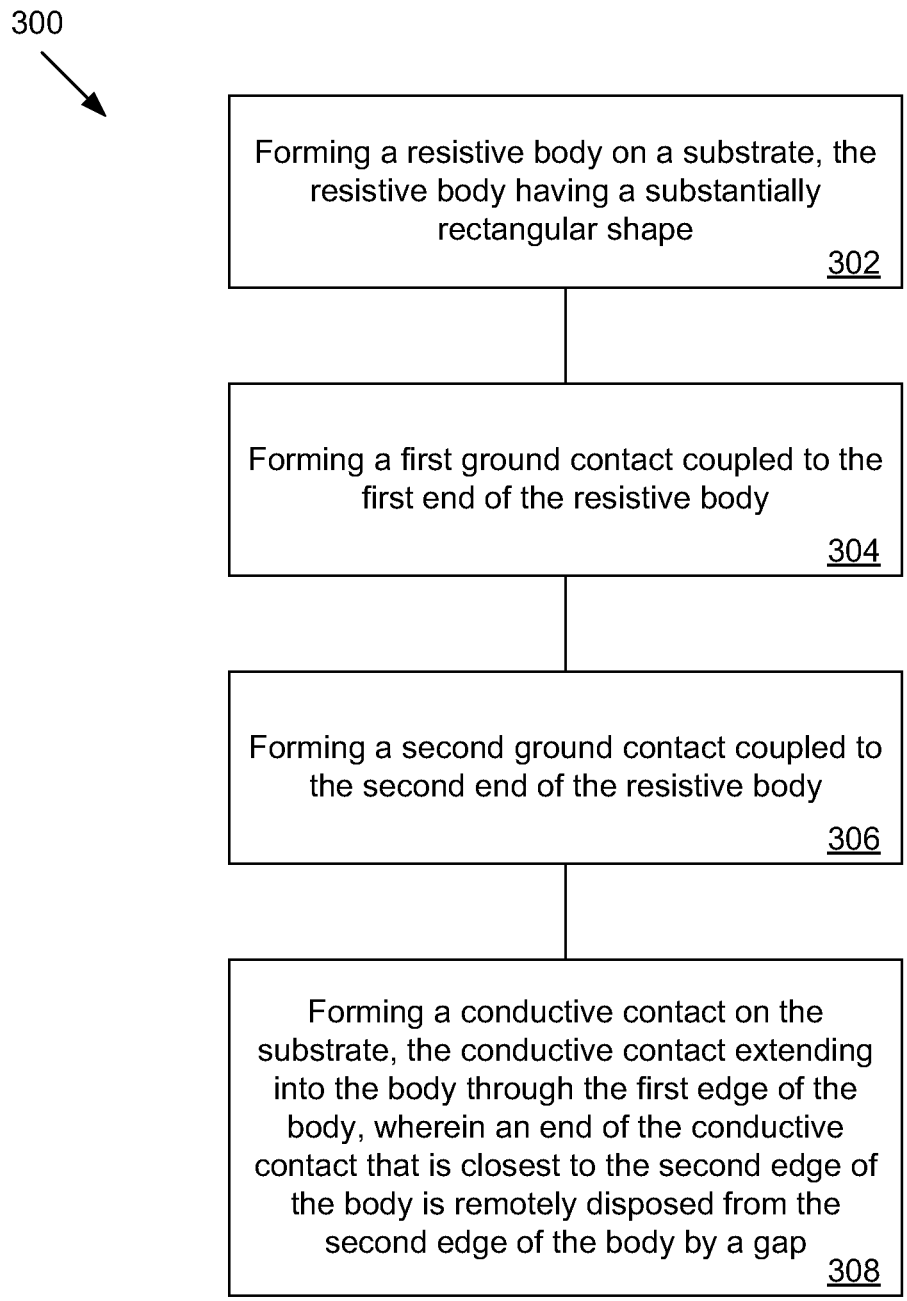
FIG. 3 is a flow diagram of a method of manufacturing a termination element in accordance with various embodiments.

FIG. 3 illustrates a method 300 of forming a termination element (e.g., termination element 100) in accordance with various embodiments. At 304, method 300 may include forming a resistive body (e.g., resistive body 104) on a substrate (e.g., substrate 102). In some embodiments, the resistive body may have a substantially rectangular shape, with a first end, a second end opposite the first end, and first and second edges running from the first end to the second end opposite one another. In some embodiments, the resistive body may be formed of TaN. In some embodiments, the resistive body may be formed in a thin film on the substrate.

At 308, the method 300 may include forming a first ground contact (e.g., ground contact 132) coupled with the first end of the resistive body to connect the first end to a ground potential. In some embodiments, forming the first ground contact may include forming one or more vias in the substrate to connect the first ground contact to the ground potential.

At 312, the method 300 may include forming a second ground contact (e.g., ground contact 136) coupled with the second end of the resistive body to connect the second end to the ground potential. In some embodiments, forming the second ground contact may include forming one or more vias in the substrate to connect the second ground contact to the ground potential.

At 316, the method 300 may include forming a conductive contact on the substrate, the conductive contact extending into the body through the first edge of the body. An end of the conductive contact that is closest to the second edge of the resistive body may be remotely disposed from the second edge by a gap (e.g., gap 156).

Figure 4:
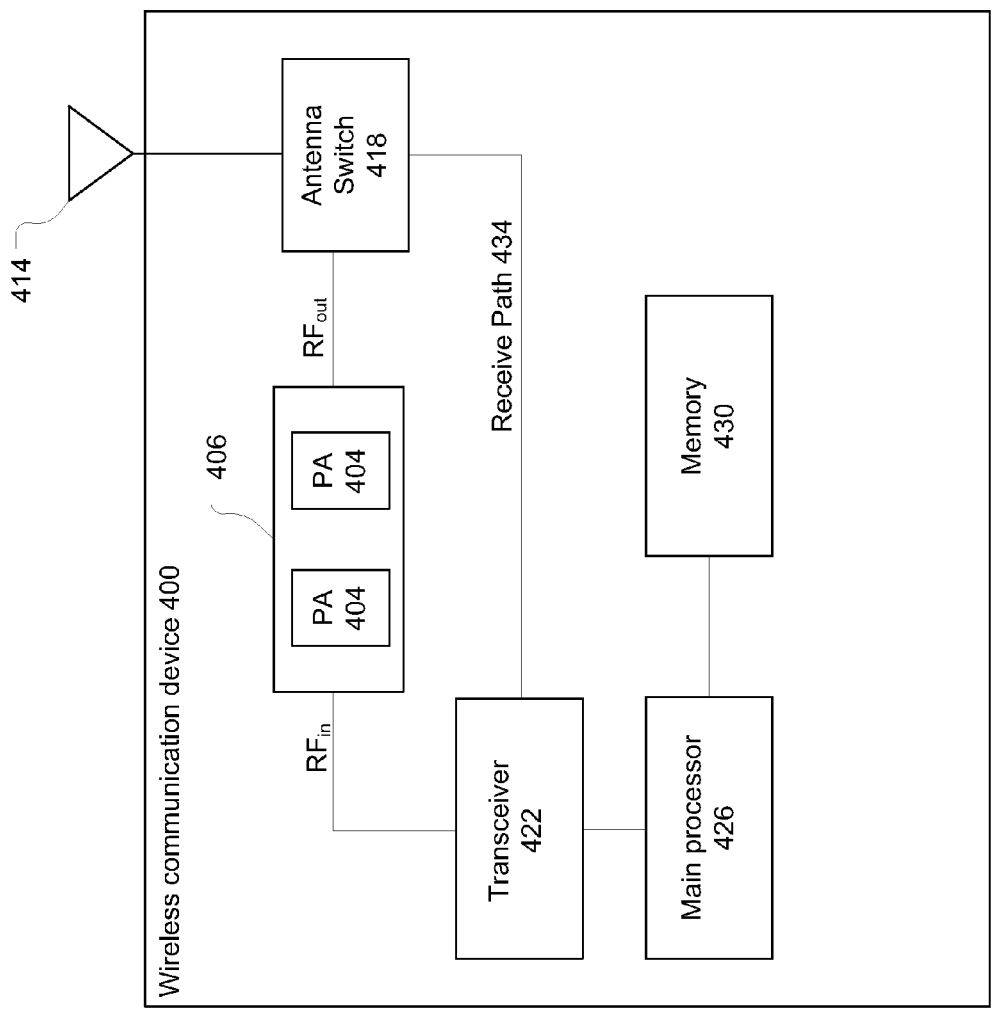
FIG. 4 is a block diagram of an exemplary wireless communication device in accordance with various embodiments.

A block diagram of an exemplary wireless communication device 400 incorporating one or more RF PA modules 404, which may be similar to RF PA module 200, is illustrated in FIG. 4 in accordance with some embodiments. The RF PA modules 404 may be included in an RF PA block 406. In addition to the RF PA modules 504, the wireless communication device 400 may have an antenna structure 414, an antenna switch 418, a transceiver 422, a main processor 426, and a memory 430 coupled with each other at least as shown. While the wireless communication device 400 is shown with transmitting and receiving capabilities, other embodiments may include devices with only transmitting or only receiving capabilities.

In various embodiments, the wireless communication device 400 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 426 may execute a basic operating system program, stored in the memory 430, in order to control the overall operation of the wireless communication device 400. For example, the main processor 426 may control the reception of signals and the transmission of signals by transceiver 422. The main processor 426 may be capable of executing other processes and programs resident in the memory 430 and may move data into or out of memory 430, as desired by an executing process.

The transceiver 422 may receive outgoing data (e.g., voice data, web data, e-mail, signaling data, etc.) from the main processor 426, may generate the $RF_{in}$ signal(s) to represent the outgoing data, and provide the $RF_{in}$ signal(s) to one or more of the RF PA modules 404. The transceiver 422 may also control the RF PA modules 404 to operate in selected bands and in either full-power or backoff-power modes.

The RF PA module 404 may amplify the $RF_{in}$ signal(s) to provide $RF_{out}$ signal(s) as described herein. The $RF_{out}$ signal(s) may be forwarded to the antenna switch 518 and then to the antenna structure 414 for an over-the-air (OTA) transmission. The antenna switch 418 may enable a plurality of the RF PA modules 404 to transmit using one or more common antennas. In other embodiments, one or more of the RF PA modules 404 may be coupled with a dedicated antenna for the individual RF PA module 404. In that case, the antenna switch 418 may not be included and/or the RF PA module 404 may be coupled directly to the antenna structure 414.

In some embodiments, the RF PA module 404 may include a filter (e.g., a duplexer) to suppress spurious emissions such as harmonics and/or noise, and/or to isolate the transmit chain from the receive chain. In these embodiments, the $RF_{out}$ signal(s) may be routed through the filter. The output of each filter may be coupled with the antenna switch 418.

In various embodiments, the transceiver 422 may also receive an incoming OTA signal from the antenna structure 414 via a receive path 434. In some embodiments, the receive path 434 may be separated from the transmit path (e.g., including the $RF_{in}$ and $RF_{out}$ signals) by the antenna switch 418 (e.g., for time division duplex (TDD) systems). In other embodiments, both the transmit and receive signals may be passed through the same arm of the antenna switch, and the receive path 424 may be separated from the transmit path by a duplexer (e.g., for frequency division duplex (FDD) systems). In some such embodiments, the duplexer may be included in the PA 404 as discussed above. The transceiver 422 may process and send the incoming signal to the main processor 426 for further processing.

In various embodiments, the antenna structure 414 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 400 is given by way of example and that, for simplicity and clarity, only so much of the construction and operation of the wireless communication device 400 as is necessary for an understanding of the embodiments is shown and described. Various embodiments contemplate any suitable component or combination of components performing any suitable tasks in association with wireless communication device 500, according to particular needs. Moreover, it is understood that the wireless communication device 400 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. An apparatus comprising:
a resistive body having a first end, a second end, and first and second edges running from the first end of the resistive body to the second end of the resistive body opposite one another;
a first ground contact coupled with the first end of the resistive body to provide a ground potential at the first end of the resistive body;
a second ground contact coupled with the second end of the resistive body to provide the ground potential at the second end of the resistive body; and
a conductive contact coupled with the resistive body, the conductive contact extending into the resistive body through the first edge of the resistive body to separate a first portion of the resistive body disposed between the first ground contact and the conductive contact from a second portion of the resistive body disposed between the second ground contact and the conductive contact, wherein a first end of the conductive contact that is closest to the second edge of the resistive body is separated from the second edge by a first gap and a second end of the conductive contact that is opposite the first end of the conductive contact and is remotely disposed from the first edge of the resistive body, in a direction opposite the second edge of the resistive body, by a second gap.

2. The apparatus of claim 1, wherein the resistive body has a substantially rectangular shape, with a length of the resistive body between the first and second ends of the resistive body being longer than a width of the resistive body between the first and second edges of the resistive body.

3. The apparatus of claim 2, wherein the conductive contact is oriented orthogonally to the first edge of the resistive body.

4. The apparatus of claim 1, wherein the conductive contact is substantially rectangular.

5. The apparatus of claim 1, wherein the conductive contact has a nonrectangular shape.

6. The apparatus of claim 1, wherein the resistive body includes Tantalum Nitride.

7. The apparatus of claim 1, further comprising a quadrature coupler, wherein the resistive body, first and second ground contacts, and conductive contact are included in a termination element coupled with the quadrature coupler, and wherein the first gap is configured to provide series inductance to reduce return loss at a frequency of a communication signal received by the quadrature coupler.

8. A method comprising:
forming a resistive body on a substrate, the resistive body having a substantially rectangular shape with a first end, a second end opposite the first end, and first and second edges running from the first end of the resistive body to the second end of the resistive body opposite one another;
forming a first ground contact coupled with the first end of the resistive body to provide a ground potential at the first end of the resistive body;
forming a second ground contact coupled with the second end of the resistive body to provide the ground potential at the second end of the resistive body; and
forming a conductive contact on the substrate, the conductive contact extending into the resistive body through the first edge of the resistive body to separate a first portion of the resistive body disposed between the first ground contact and the conductive contact from a second portion of the resistive body disposed between the second ground contact and the conductive contact, wherein a first end of the conductive contact that is closest to the second edge of the resistive body is separated from the second edge by a first gap and a second end of the conductive contact that is opposite the first end of the conductive contact and is remotely disposed from the first edge of the resistive body, in a direction opposite the second edge of the resistive body, by a second gap.

9. The method of claim 8, wherein a length of the resistive body between the first and second ends of the resistive body is longer than a width of the resistive body between the first and second edges of the resistive body.

10. The method of claim 9, wherein the conductive contact is oriented orthogonally to the first edge of the resistive body.

11. The method of claim 8, wherein forming the first and second ground contacts includes forming vias in the substrate to couple the first and second ground contacts with the ground potential.

12. A system comprising:
a first amplifier having an input terminal and an output terminal;
a second amplifier having an input terminal and an output terminal;
a power combining quadrature coupler including:
a first input port coupled with the output terminal of the first amplifier;
a second input port coupled with the output terminal of the second amplifier;
an output port configured to pass an output signal based on signals received at the first and second input ports; and
an isolation port; and
a termination element coupled with the isolated port, the termination element including:
a resistive body having a first end, a second end, and first and second edges running from the first end of the resistive body to the second end of the resistive body opposite one another;
a first ground contact coupled with the first end of the resistive body to provide a ground potential at the first end of the resistive body;
a second ground contact coupled with the second end of the resistive body to provide the ground potential at the second end of the resistive body; and
a conductive contact coupled with the resistive body and to the isolation port of the quadrature coupler, wherein the conductive contact crosses the first edge of the resistive body to separate a first portion of the resistive body disposed between the first ground contact and the conductive contact from a second portion of the resistive body disposed between the second ground contact and the conductive contact, and wherein the conductive contact includes:

a first end disposed between the first and second edges of the resistive body and separated from the second edge by a first gap; and a second end extending away from the first edge of the resistive body, in a direction opposite the second edge of the resistive body, by a second gap.

13. The system of claim 12, wherein the termination element is a first termination element, and the system further comprising:

a power dividing quadrature coupler including:

an input port configured to receive an input signal;

first and second output ports coupled with the input terminals of the respective first or second amplifiers, the first and second output ports configured to pass power-divided versions of the input signal; and an isolation port; and a second termination element coupled with the isolation port of the power dividing quadrature coupler, the second termination element having a same design as the first termination element.

14. The system of claim 13, wherein the first and second gaps are configured to provide series inductance for the transistor to reduce return loss at a frequency of the input signal.

15. The system of claim 12, wherein the resistive body has a substantially rectangular shape, with a length of the resistive body between the first and second ends of the resistive body being longer than a width of the resistive body between the first and second edges of the resistive body.

16. The system of claim 15, wherein the conductive contact is oriented orthogonally to the first edge of the resistive body.

17. The system of claim 12, wherein the system comprises a monolithic microwave integrated circuit (MMIC).

18. The apparatus of claim 12, wherein the resistive body includes Tantalum Nitride.

19. The apparatus of claim 1, wherein the apparatus is a monolithic integrated circuit element formed on a substrate.

* * * * *

UNITED STATES PATENT AND TRADEMARK OFFICE
CERTIFICATE OF CORRECTION

| | |
|---|---|
| PATENT NO. | : 9,209,507 B1 |
| APPLICATION NO. | : 13/929429 |
| DATED | : December 8, 2015 |
| INVENTOR(S) | : Charles F. Campbell |

It is certified that error appears in the above-identified patent and that said Letters Patent is hereby corrected as shown below:

In the Specification:

Column 2, line 19, replace ""NB"" with --"A/B"--.

Signed and Sealed this
Seventeenth Day of May, 2016

Michelle K. Lee
*Director of the United States Patent and Trademark Office*